(12) United States Patent
Endress et al.

(10) Patent No.: US 9,609,794 B2
(45) Date of Patent: Mar. 28, 2017

(54) CONVEYOR DEVICE FOR PRINTED CIRCUIT BOARDS

(71) Applicant: ERSA GmbH, Wertheim (DE)

(72) Inventors: Lothar Endress, Wertheim (DE); Hermann Beck, Wurzberg (DE)

(73) Assignee: ERSA GMBH, Wertheim (DE)

( * ) Notice: Subject to any disclaimer, the term of this patent is extended or adjusted under 35 U.S.C. 154(b) by 0 days.

(21) Appl. No.: 14/421,075

(22) PCT Filed: Jul. 17, 2013

(86) PCT No.: PCT/DE2013/000384
§ 371 (c)(1),
(2) Date: Feb. 11, 2015

(87) PCT Pub. No.: WO2015/007255
PCT Pub. Date: Jan. 22, 2015

(65) Prior Publication Data
US 2016/0120079 A1    Apr. 28, 2016

(51) Int. Cl.
*B65G 47/84* (2006.01)
*H05K 13/00* (2006.01)
(Continued)

(52) U.S. Cl.
CPC ......... *H05K 13/0069* (2013.01); *B23K 1/008* (2013.01); *B23K 1/0016* (2013.01);
(Continued)

(58) Field of Classification Search
CPC .. B65G 47/842; B65G 47/847; B65G 17/323; B65G 29/00; B65G 17/42
(Continued)

(56) References Cited

U.S. PATENT DOCUMENTS 4,397,411 A    8/1983  Vetter
4,826,065 A *  5/1989  Natterer ................. B65H 20/16
                                                226/173
(Continued)

FOREIGN PATENT DOCUMENTS

CN    103010784 A    4/2013
DE    2151583 A1    6/1972
(Continued)

OTHER PUBLICATIONS

PCT English Language Translation of the International Preliminary Report on Patentability, PCT/DE2013/000384, Jan. 28, 2016.
(Continued)

*Primary Examiner* — James R Bidwell
(74) *Attorney, Agent, or Firm* — Quarles & Brady LLP

(57) ABSTRACT

A conveyor device for printed circuit boards includes a carrier that continuously circulates between conveyor wheels. At least one carrier element supporting placement of the printed circuit board and at least one resilient clamping element clamping the printed circuit board on the carrier element are arranged on the carrier. A switching device moves the clamping element back and forth between an open position of the clamping element, in which the printed circuit board can be loosely placed onto the carrier element, and a spring-loaded closed position of the clamping element, in which the printed circuit board can be pressed onto the carrier element by the clamping element.

13 Claims, 4 Drawing Sheets

(51) Int. Cl.
  *B65G 17/32*  (2006.01)
  *B23K 1/00*  (2006.01)
  *B23K 1/008*  (2006.01)
  *B23K 3/08*  (2006.01)
  *B23K 101/42*  (2006.01)

(52) U.S. Cl.
  CPC ............ *B23K 3/087* (2013.01); *B65G 17/323* (2013.01); *B23K 2201/42* (2013.01)

(58) Field of Classification Search
  USPC .................. 198/626.6, 817, 803.7, 803.9
  See application file for complete search history.

(56) References Cited

U.S. PATENT DOCUMENTS

| | | | | |
|---|---|---|---|---|
| 4,840,268 A | * | 6/1989 | Zemek | ............ B65G 17/48 198/817 |
| 4,874,081 A | * | 10/1989 | Kondo | ............ H05K 13/0061 198/803.9 |
| 4,918,796 A | | 4/1990 | Gresens | |
| 5,048,268 A | * | 9/1991 | Brembilla | ............ B65B 31/021 226/173 |
| 5,145,055 A | * | 9/1992 | Kondo | ............ B65G 17/26 198/803.9 |
| 5,791,453 A | | 8/1998 | Schmits et al. | |
| 6,786,326 B2 | * | 9/2004 | Hiramoto | ............ B65G 37/005 198/817 |
| 7,398,875 B2 | * | 7/2008 | Niesar | ............ B65B 41/14 198/803.7 |

FOREIGN PATENT DOCUMENTS

| | | |
|---|---|---|
| DE | 30 22 065 | 12/1981 |
| DE | 30 25 697 | 1/1982 |
| DE | 3432177 | 1/1986 |
| DE | 196 29 923 | 3/1997 |
| EP | 0 480 585 | 4/1992 |
| JP | S57 183 777 | 11/1982 |
| WO | 2007137629 A1 | 12/2007 |

OTHER PUBLICATIONS

The International Search Report as mailed on Mar. 28, 2014 for International Application No. PCT/DE2013/000384.
State Intellectual Property Office of People's Republic of China, First Office Action and Search Report, Application No. 201380049438.2, Jul. 25, 2016, 12 pages.

* cited by examiner

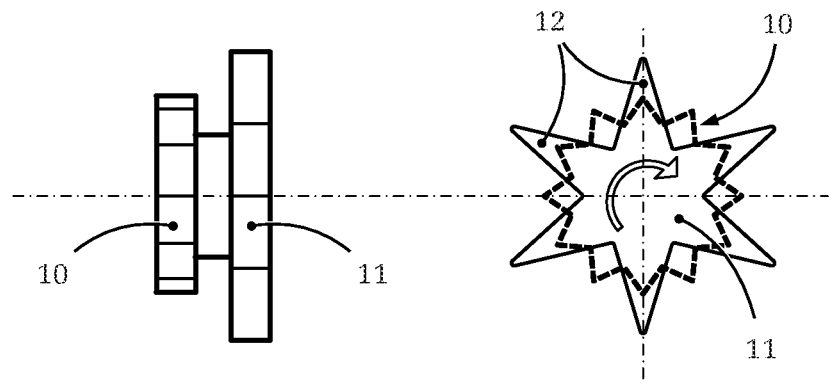

CONVEYOR DEVICE FOR PRINTED CIRCUIT BOARDS

CROSS-REFERENCE TO RELATED APPLICATIONS

This application represents the national stage entry of PCT International Application No. PCT/DE2013/000384 filed Jul. 17, 2013. The contents of this application are hereby incorporated by reference as if set forth in their entirety herein.

The invention relates to a conveyor device for printed circuit boards.

In the case at hand, the term "printed circuit board" used in the following for the sake of clarity and brevity is to generally represent a thin plate-shaped element in the sense of the invention. Said thin plate-shaped element can in particular be a printed circuit board in the traditional sense; however, it may also be a film element, for example, such as a flexible printed circuit board consisting of polyester film or the like. In the sense of the present invention, the term "printed circuit board" is also to comprise endless plate-shaped elements, such as long or endless rigid or flexible printed circuit boards.

During heat treatment, in particular in machine soldering processes, printed circuit boards are regularly conveyed through process lines. Known applications by means of which the printed circuit boards are conveyed through a reflow soldering furnace or a wave soldering furnace, for example, usually comprise two parallel conveyor devices having carrier means that synchronously circulate through the soldering furnace, such as conveyor chains. Oftentimes, the printed circuit boards are placed onto the circulating carrier means at two opposing lateral edges.

In particular circuit boards whose ratio of width to thickness is unfavorable, also flexible or film-based printed circuit boards, may bend at the center when become increasingly hot in the soldering furnace. This poses the risk that the printed circuit boards may slide off the conveyor device with their lateral edges, which were placed on the conveyor device. Further, it is possible that circuit boards bent in this manner stay warped after cooling, which may lead to undesired rejects in production.

To counteract problems of this kind, first of all, devices for supporting the center of printed circuit boards in a conveyor device are known. Such devices for center support serve to support the printed circuit boards in at least one position between the opposing lateral edges of the circuit boards. Known systems use a circulating rope or a circulating chain, for example, which supports the printed circuit boards, e.g., at the center. Punctually supporting co-circulating support bolts are known as well.

However, additional devices of this kind for centrally supporting printed circuit boards are elaborate and thus tend to be expensive.

Also, for the purpose of installing such a co-circulating center support at the bottom side of the respective printed circuit board, corresponding space has to be provided, and an undesired shadow effect due to the center support of the circuit boards occurs in the soldering process. In case of printed circuit boards that are to be equipped at both sides and that are to be soldered in a reflow process, for example, this may mean that a strip free of components in the conveying direction has to be provided for the circulating center support when designing the layout of the printed circuit board. However, this is not desired, in particular with smaller or narrow printed circuit boards.

From DE 196 29 923 A1, a conveyor device is further known in which resilient fixing fingers are arranged on the conveyor means, such as link chains, circulating in the soldering furnace. The resilient fixing fingers are supposed to protect the circuit boards against undesired bending by the resilient fixing fingers pressing the circuit boards onto corresponding supports on the link chains. However, said known resilient fixing fingers may complicate in particular the processes of placing and likewise of removing the circuit boards into and from the conveyor device.

Therefore, it is the object of the invention to create a conveyor device for printed circuit boards by means of which the afore-mentioned disadvantages and limitations are overcome. In particular, an undisturbed and low-warpage circulation of the circuit boards through the soldering furnace is to be ensured even if there is no center support for the circuit board in the conveyor device or if no center support is to be employed in the given case.

The object is attained by a conveyor device according to the teaching of patent claim 1. Advantageous embodiments of the invention are the subject-matter of the dependent claims.

The conveyor device according to the present invention has, in an initially known manner, at least one carrier means, such as a link chain, that continuously circulates between conveyor wheels and is linearly guided at least in sections. On the at least one circulating carrier means, at least one carrier element for supporting placement of the printed circuit board and at least one resilient clamping element for clamping the printed circuit board on the carrier element of the carrier means are arranged.

According to the invention, the conveyor device is characterized, however, in that the at least one clamping element can be moved back and forth between an open position and a closed position by means of a switching device. In the open position of the clamping element, the printed circuit board can be loosely placed onto the at least one carrier element of the carrier means, and in the closed position of the clamping element, the printed circuit board is pressed onto the carrier element by the clamping element.

First of all, this offers the advantage that the at least one clamping element can be selectively opened and closed by means of the switching device. In this manner, placement and removal of the printed circuit board into and from the conveyor device is facilitated. Likewise, the point and the time of placement and/or removal of the printed circuit board into and from the conveyor device can be adapted to the marginal conditions of the furnace circulation and of the soldering process owing to the actively movable clamping element.

By means of the resilient clamping element, the circuit board is pressed onto the carrier element or onto the carrier elements of the circulating carrier means. The effective surfaces of the carrier elements and/or of the clamping elements can be designed in such a manner that the clamping effect causes the respective edges of the circuit boards to be clamped in a non-flexible manner in such a way that undesired bending of the circuit boards during circulation through the soldering furnace is counteracted.

According to a preferred embodiment of the invention, the switching device comprises an opening device for moving the clamping element from the closed position into the open position. The opening device is preferably arranged directly in the area of one of the conveyor wheels, which deflect and drive the at least one carrier means, such as the circulating link chains of the conveyor device.

In this manner, a compact and space-saving arrangement of the switching device and of the opening device is achieved, and the motion of the clamping elements from the closed position into the open position can sensibly take place directly in the area of removal of the circuit boards from the conveyor device, in particular at the end of the linearly guided portion of the carrier means or link chains.

According to a particularly preferred embodiment of the invention, the opening device is realized as an opening wheel and is directly connected to a conveyor wheel or formed in one piece with the conveyor wheel. Preferably, the opening device is realized as an opening wheel having at least one actuating finger. The actuating finger is adapted to move the clamping element from the closed position into the open position by the actuating finger bearing against the clamping element when the opening wheel rotates.

In this manner, an actuation of the clamping elements is realized that can be implemented particularly easily in terms of construction and that is robust during operation of the conveyor device while requiring a minimal number of moving parts, in the form of the opening wheel preferably being arranged directly on a drive or conveyor wheel of the circulating link chain.

Initially, the invention is realized independently of how the clamping element is constructively designed and arranged or attached relative to the carrier element of the circulating carrier means or of the link chain as long as the intended clamping effect with respect to the circuit board relative to the carrier element can be achieved. According to a particularly preferred embodiment of the invention, however, the clamping element is realized as a spring-loaded trap and is connected to the carrier element via a hinge axle. This embodiment offers a design of the clamping element that is in particular constructively simple and that can be cost-effectively realized.

Another particularly preferred embodiment of the invention provides that the closed position and the open position of the clamping element each are stable positions of the clamping element.

In other words, this means that the clamping element, which can be moved back and forth between its closed position and its open position, is designed to be bistable, and thus it remains stable both in its spring-loaded closed position and in its open position, i.e. in particular without continued engagement by the switching device, the opening device or the opening wheel.

Preferably, the switching device for the at least one clamping element comprises a closing device that is separate from the opening device and by means of which the (bi-stable) clamping element can be brought from its stable open position back into the spring-loaded closed position.

In this manner, the process of clamping the printed circuit board within the conveyor device and also the process of releasing the printed circuit board from the conveyor device, such as after circulation through the soldering furnace, can take place by means of corresponding actuation devices, which can be arranged separately from one another at any position in the course of the circuit board conveying path. In particular, e.g., the closing device for moving the clamping elements from the open position into the spring-loaded closed position can be positioned entirely independently of the opening device, which is arranged, for example, as an opening wheel at the conveyor wheel, in particular at any point along the linear course of the carrier means.

With this background, another preferred embodiment of the invention provides that at least one tension spring is arranged between the clamping element and the carrier element in such a manner that the clamping element is kept stable both in the open position and in the closed position by means of the tension spring. In this way, a constructively simple implementation of the bistable design of the clamping element becomes possible. For example, this may be realized by selecting the course of the tension spring in such a manner that the longitudinal axis of the tension spring travels back and forth over the hinge axle of the clamping element when the clamping element is being moved between its open position and its closed position.

Another preferred embodiment of the invention provides that the clamping element and/or the carrier element are each realized as one-piece bent sheet metal parts. Preferably, the hinge axle, via which the clamping element and the carrier element are preferably interconnected, is additionally formed in one piece with the clamping element or with the carrier element, in particular in the form of a punched part. In this way, a constructively particularly simple production and assembly of the conveyor device becomes possible, in particular at a minimal number of parts, which is advantageous regarding costs.

In the following paragraphs, the invention will be described in more detail with the aid of drawings, which merely illustrate embodiment examples.

In the figures:

FIG. 3 shows, in a schematic illustration, the conveyor wheel and the opening wheel of a conveyor device according to the present invention in the lateral view;

FIG. 4 shows, in a schematic illustration, the conveyor wheel and the opening wheel according to FIG. 3 in a top view.

Figure 1:
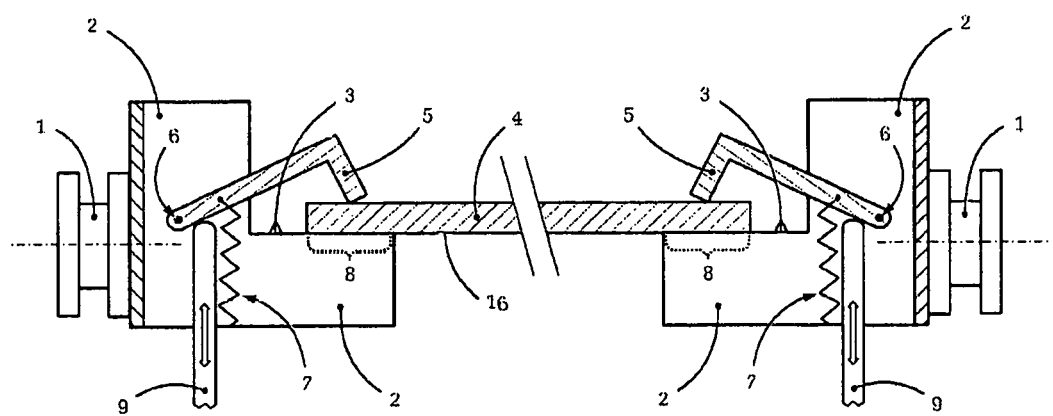
FIG. 1 shows, in a schematic illustration, a partial section through a conveyor device according to an embodiment of the present invention.
Figure 2:
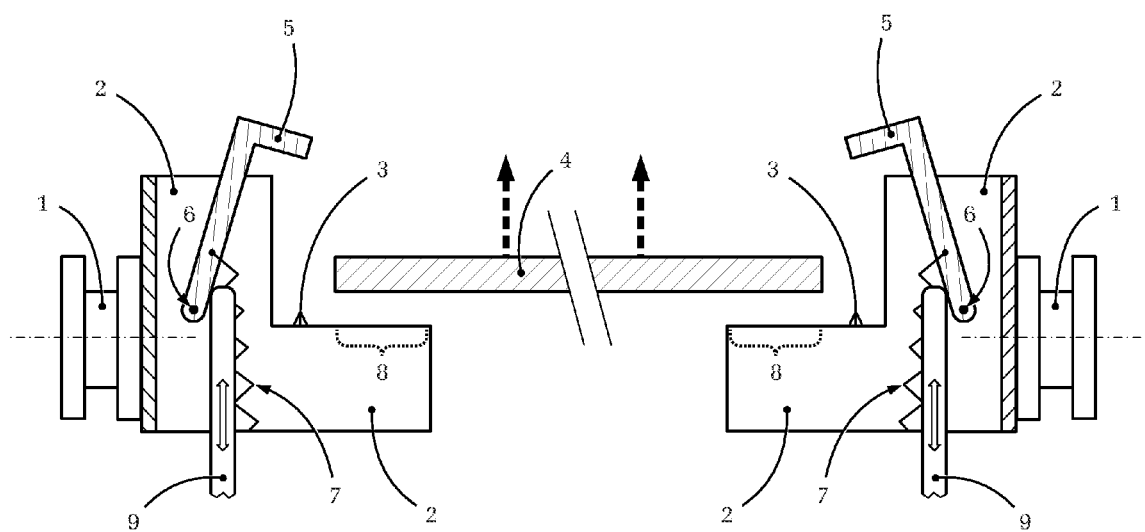
FIG. 2 shows, in an illustration and view corresponding to FIG. 1, the conveyor device according to FIG. 1 in the open position.

In a highly schematic illustration, FIG. 1 and FIG. 2 each show a partial section through a conveyor device according to an embodiment of the present invention.

In FIG. 1 and FIG. 2, two link chains 1 are visible in each case, said link chains 1 circulating along the conveyor device (here vertically to the drawing plane). On each of the link chains 1, a plurality of carrier elements 2 is arranged (of which only one carrier element 2 per link chain 1 is visible or illustrated in FIG. 1 and FIG. 2). The carrier elements 2 have placement areas 3, on which a schematically indicated circuit board 4 is arranged in FIG. 1.

The conveyor device further comprises clamping elements 5 that are respectively associated with the carrier elements 2 and can pivot about a hinge axle 6 with respect to the carrier elements 2. The clamping elements 5 are each pressed in the direction of the placement areas 3 of the carrier elements 2 by a screw spring 7 in such a manner that the circuit board 4 is clamped between the clamping elements 5 and the placement areas 3 of the carrier elements 2. The clamping effect of the spring-loaded clamping elements 5, together with the placement width 8 of the circuit board 4 on the placement areas 3, leads to a so-called fixed bar clamping of the circuit board at its two longitudinal sides, wherein the fixed clamping can absorb bending torques potentially occurring in the circuit board because of the clamping elements 5 (in contrast to a merely loosely placed circuit board) and can induce corresponding counter torques into the circuit board. Thus, the circuit board is stabilized, and bending or sagging of the circuit board in its central area during circulation through the soldering furnace is significantly reduced.

In the illustrated embodiment, switching of the clamping elements 5 between the closed position according to FIG. 1 and the open position according to FIG. 2, wherein the circuit board 4 can be easily removed from the conveyor device with the clamping elements 5 in the open position according to FIG. 2, takes place by means of opening actuators 9, which are also only schematically indicated.

As becomes clear from a combined view of FIG. 1 and FIG. 2, the opening actuators 9 control the position of the clamping elements 5 between the closed position according to FIG. 1 and the open position according to FIG. 2 by means of vertical deflections. The opening actuators 9 do not necessarily have to be designed in the shape of pins or be actuatorically moveable in the vertical direction. Instead, the opening actuators 9 can also be formed by rigid rail-shaped guides 9 that run at varying heights along the moving direction of the link chains 1 (vertically to the drawing plane) so that the clamping elements 5 are opened and closed as a result of movement of the clamping elements 5 following the link chains 1 corresponding to the height profile of the rail-shaped guides 9.

Another way of actuation for the clamping elements 5 between the closed position according to FIG. 1 and the open position according to FIG. 2 is illustrated in FIGS. 3 and 4.

First of all, FIGS. 3 and 4 show a gear or a conveyor wheel 10 for driving or guiding and deflecting one of the link chains 1 of the conveyor device according to FIGS. 1 and 2. Furthermore, an opening wheel 11, 12 (here illustrated schematically in the shape of a star) is directly connected to or formed in one piece with the conveyor wheel 10. The opening wheel 11, 12 has a plurality of actuating fingers 12 that serve to move the clamping element between the closed position according to FIG. 1 and the open position according to FIG. 2.

Figure 5:
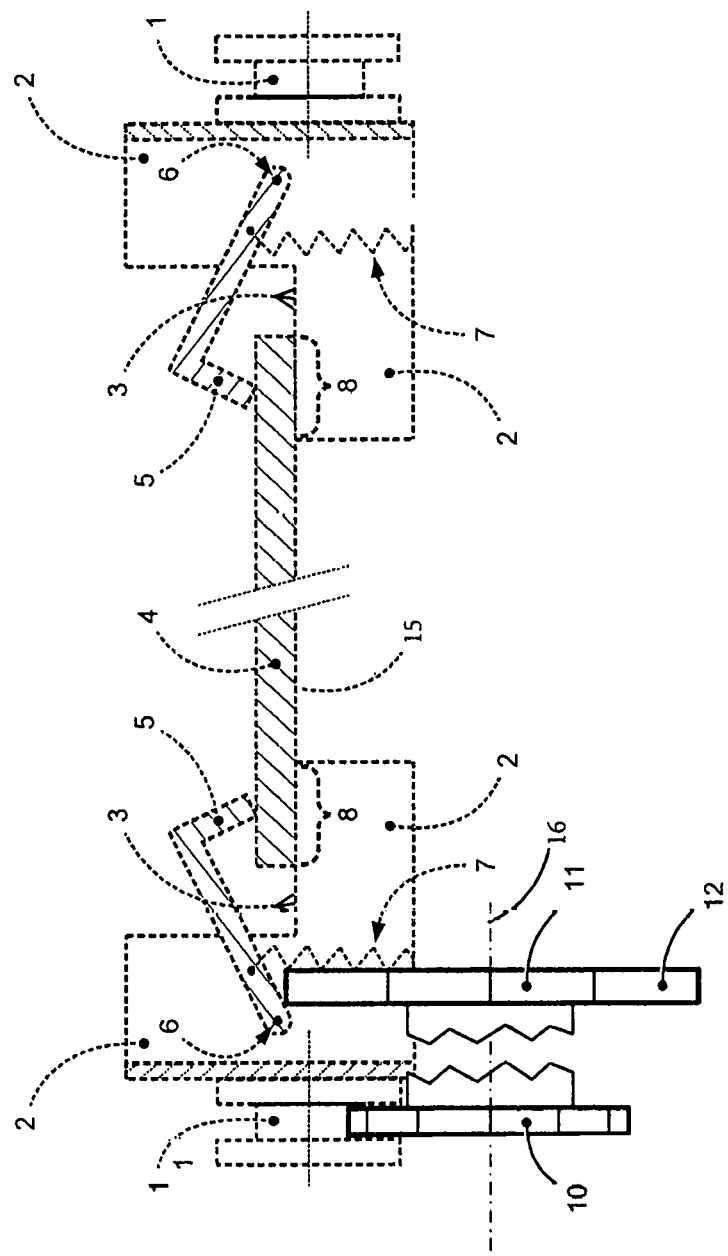
FIG. 5 shows, in a schematic illustration, the conveyor wheel and the opening wheel according to FIGS. 3 and 4 incorporated into the embodiment shown in FIG. 1.

In FIG. 5 showing a combined view of FIG. 4 and 1 or 2, the actuating fingers 12 of the opening wheel 11, 12 can be identified with or compared to the opening actuators 9, for example, when it is assumed in this respect that the conveyor device according to FIGS. 1 and 2 is provided with conveyor wheels 10 and opening wheels 11, 12 according to FIGS. 3 and 4. In other words, this means that the conveyor device in this case is provided with the illustrated combination of a conveyor wheel 10 for driving the link chain 1 and with an opening wheel 11, 12 for actuating the clamping elements 5. As shown in FIG. 5, the conveyor wheel 10 directly connected to the opening wheel 11, 12 rotates about axis 16 parallel to plane 15 defined by placement planar area 3.

Hereby, the clamping elements 5 are opened at least always as long as the link chain 1 runs across the respective conveyor wheel 10/opening wheel 11, 12 with the respective carrier element 2 and the respective clamping element 5. In other words, this means that at least during the deflection phase of the link chain 1 via the conveyor wheel 10, the clamping elements 5 are in their open position and subsequently they either automatically drop back into their closed position in a spring-loaded manner (monostable clamping elements 5 such as illustrated in FIGS. 1 and 2) or are brought from their open position into their closed position by a separate closing device in the further course of transport into and through the soldering furnace (embodiment described further above but not specifically illustrated having bistable clamping elements).

An embodiment of the conveyor device having opening wheels 11, 12, as illustrated in FIG. 3 and FIG. 4, is advantageous in particular with regard to the thus provided constructively particularly simple actuation and switching of the clamping elements 5 between the open position according to FIG. 2 and the closed position according to FIG. 1 without specifically requiring other devices on or in the conveyor device.

LIST OF REFERENCE SIGNS

1 carrier means, link chain
2 carrier element
3 placement area
4 printed circuit board, circuit board
5 clamping element
6 hinge axle
7 tension spring, screw spring
8 placement width
9 switching device, opening actuator
10 conveyor wheel
11 opening device, opening wheel
12 actuating finger

The invention claimed is:

1. A device suitable for conveying a rigid or flexible film-shaped, printed circuit board through a soldering furnace, said conveyor device comprising:
    at least one carrier continuously circulating between conveyor wheels and linearly guided at least in sections;
    at least one carrier element arranged on the carrier for supporting placement of a printed circuit board on a substantially planar placement area of said at least one carrier element defining a plane; and
    at least one resilient clamping element for clamping the printed circuit board on the carrier element, said clamping being in a direction substantially perpendicular to the plane defined by the planar placement area of the carrier element, wherein the conveyor wheels guiding the carrier rotate about an axis that extends substantially parallel to said plane defined by said planar placement area of the carrier element;
    a switching device moving the clamping element between an open position of the clamping element, in which the printed circuit board can be loosely placed onto the planar placement area of the carrier element, and a spring-loaded closed position of the clamping element, in which the printed circuit board can be pressed onto the planar placement area of the carrier element by the clamping element.

2. The conveyor device according to claim 1, in which the switching device includes an opening device for moving the clamping element from the closed position into the open position.

3. The conveyor device according to claim 2, in which the opening device is arranged directly in the area of one of the conveyor wheels.

4. The conveyor device according to claim 3, in which the opening device is an opening wheel directly connected to a conveyor wheel or is formed in one piece with a conveyor wheel.

5. The conveyor device according to claim 2, in which the opening device is an opening wheel having at least one actuating finger, said actuating finger being adapted to move the clamping element from the closed position into the open position by the actuating finger bearing against the clamping element by way of rotation of the opening wheel.

6. The conveyor device according to claim 1, in which the clamping element is a trap that is loaded by a spring and connected to the carrier element via a hinge axle.

7. The conveyor device according to claim 2, in which both the closed position and the open position of the clamping element are stable positions of the clamping element.

8. The conveyor device according to claim 7, in which the switching device includes a closing device that is separate from the opening device and by means of which the clamping element can be brought from its stable open position into the spring-loaded closed position.

9. The conveyor device according to claim 7, in which at least one tension spring is arranged between the clamping element and the carrier element is arranged in such a manner that the clamping element is kept stable both in the open position and in the closed position by the tension spring.

10. The conveyor device according to claim 1, in which the clamping element and/or the carrier element are each a one-piece bent sheet metal part.

11. The conveyor device according to claim 6, in which the hinge axle is formed as one piece with the clamping element or with the carrier element.

12. The conveyor device according to claim 6, in which the spring is a tension spring.

13. A device suitable for conveying a rigid or flexible film-shaped, printed circuit board through a soldering furnace, said conveyor device comprising:

at least one carrier continuously circulating between conveyor wheels and linearly guided at least in sections;

at least one carrier element arranged on the carrier for supporting placement of a printed circuit board; and at least one resilient clamping element for clamping the printed circuit board on the carrier element, wherein the conveyor wheels guiding the carrier can be rotated about an axis that extends substantially parallel to a plane of the printed circuit board, and that by means of a switching device, the clamping element can be moved back and forth between an open position of the clamping element, in which the printed circuit board can be loosely placed onto the carrier element, and a spring-loaded closed position of the clamping element, in which the printed circuit board can be pressed onto the carrier element by the clamping element, wherein the switching device includes an opening device for moving the clamping element from the closed position into the open position, and the opening device is an opening wheel having at least one actuating finger, said actuating finger being adapted to move the clamping element from the closed position into the open position by the actuating finger bearing against the clamping element by way of rotation of the opening wheel.

* * * * *